(12) United States Patent
Chou et al.

(10) Patent No.: US 9,263,337 B2
(45) Date of Patent: Feb. 16, 2016

(54) SEMICONDUCTOR DEVICE AND METHOD OF MANUFACTURE

(75) Inventors: Chun-Li Chou, Jhubei (TW); Shao-Yen Ku, Jhubei (TW); Chi-Yun Tseng, Longtan Township (TW); Yu-Yen Hsu, Taipei (TW); Tsai-Pao Su, Donggang Township (TW); Hobin Chen, Xiushui Township (TW); Sheng-Chi Shih, Toufen Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 162 days.

(21) Appl. No.: 13/414,898

(22) Filed: Mar. 8, 2012

(65) Prior Publication Data

US 2013/0109140 A1     May 2, 2013

Related U.S. Application Data

(60) Provisional application No. 61/554,862, filed on Nov. 2, 2011.

(51) Int. Cl.
| | |
|---|---|
| *H01L 21/8238* | (2006.01) |
| *H01L 21/8234* | (2006.01) |
| *H01L 29/78* | (2006.01) |
| *H01L 29/66* | (2006.01) |
| *H01L 29/165* | (2006.01) |
| *H01L 21/02* | (2006.01) |
| *H01L 21/306* | (2006.01) |
| *H01L 21/67* | (2006.01) |

(52) U.S. Cl.
CPC .. *H01L 21/823412* (2013.01); *H01L 21/02057* (2013.01); *H01L 21/30608* (2013.01); *H01L 21/6708* (2013.01); *H01L 21/67017* (2013.01); *H01L 21/823425* (2013.01); *H01L 29/165* (2013.01); *H01L 29/66575* (2013.01); *H01L 29/66628* (2013.01); *H01L 29/66636* (2013.01); *H01L 29/7834* (2013.01); *H01L 29/7848* (2013.01)

(58) Field of Classification Search
CPC ............... H01L 29/7848; H01L 29/66636; H01L 29/165; H01L 29/66575; H01L 29/66628; H01L 29/7834
USPC ......... 438/303, 300, 705, 733, 734, 222, 700, 438/739
See application file for complete search history.

(56) References Cited

U.S. PATENT DOCUMENTS

| | | | | |
|---|---|---|---|---|
| 4,976,810 | A * | 12/1990 | Masuda et al. | 216/49 |
| 5,413,671 | A * | 5/1995 | Ketchum | 216/37 |
| 6,475,291 | B1 * | 11/2002 | Petvai et al. | 134/3 |
| 7,045,407 | B2 * | 5/2006 | Keating et al. | 438/198 |
| 8,709,897 | B2 * | 4/2014 | Sung et al. | 438/285 |
| 2008/0014688 | A1 * | 1/2008 | Thean et al. | 438/197 |
| 2010/0219474 | A1 * | 9/2010 | Kronholz et al. | 257/347 |
| 2010/0295127 | A1 * | 11/2010 | Cheng et al. | 257/347 |
| 2010/0301350 | A1 * | 12/2010 | Tamura et al. | 257/77 |
| 2010/0311218 | A1 * | 12/2010 | Fukutome et al. | 438/300 |
| 2011/0121315 | A1 * | 5/2011 | Ohta et al. | 257/77 |
| 2012/0161105 | A1 * | 6/2012 | Rachmady et al. | 257/19 |
| 2012/0299058 | A1 * | 11/2012 | Huang et al. | 257/190 |
| 2013/0095627 | A1 * | 4/2013 | Flachowsky et al. | 438/285 |

* cited by examiner

*Primary Examiner* — Bac Au
(74) *Attorney, Agent, or Firm* — Slater & Matsil, L.L.P.

(57) ABSTRACT

A system and method for etching a substrate is provided. An embodiment comprises utilizing an inert carrier gas in order to introduce a liquid etchant to a substrate. The inert carrier gas may prevent undesirable chemical reactions from taking place during the etching process, thereby helping to reduce the number of defects that occur to the substrate and other structures during the etching process.

20 Claims, 10 Drawing Sheets

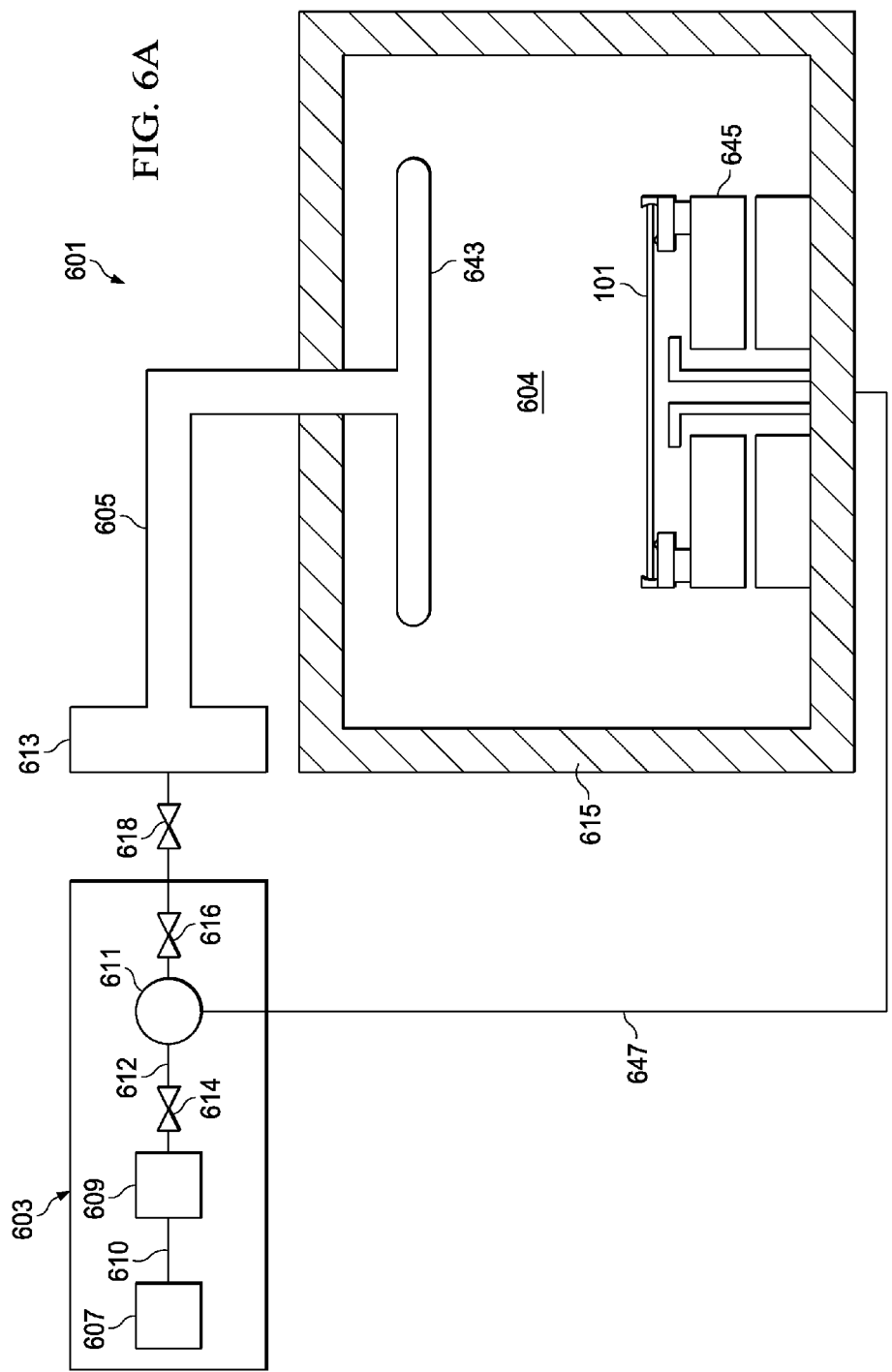

SEMICONDUCTOR DEVICE AND METHOD OF MANUFACTURE

This application claims the benefit of U.S. Provisional Application Ser. No. 61/554,862, filed on Nov. 2, 2011, entitled "Semiconductor Device and Method of Manufacture," which application is hereby incorporated herein by reference.

BACKGROUND

Generally, when an opening into a substrate is desired, the substrate may be initially masked by either a photoresist, hard mask, or other mask to protect those areas of the substrate where an opening is not desired. Once those areas are protected, the exposed portions of the substrate may be exposed to an etchant in order to react and remove the exposed material of the substrate to form the opening. Once the etchant has reacted with the material of the substrate and formed the opening to a desired depth, the etchant may be removed from the substrate, and other various processes may be utilized as desired in order to continue the manufacturing of the semiconductor device on the substrate.

In the etching process, a wet etch may be utilized in which the substrate is coated with the desired etchant in a liquid phase (instead of a vapor phase). The desired liquid etchant may be supplied from an etchant canister to an etching chamber, where a showerhead may then be used to disperse the etchant evenly across the substrate such that the desired liquid etchant is in contact with the exposed portions of the substrate. Once in contact with the exposed portions of the substrate, the etchant will begin to react with the substrate to form the desired opening where the masks do not protect the substrate.

BRIEF DESCRIPTION OF THE DRAWINGS

For a more complete understanding of the embodiments, and the advantages thereof, reference is now made to the following descriptions taken in conjunction with the accompanying drawings, in which:

FIG. 6A-6B illustrate an etching system that may be utilized to perform the second etch in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely an etching process utilized to etch a semiconductor substrate. The embodiments may also be applied, however, to other etching processes.

Figure 1:
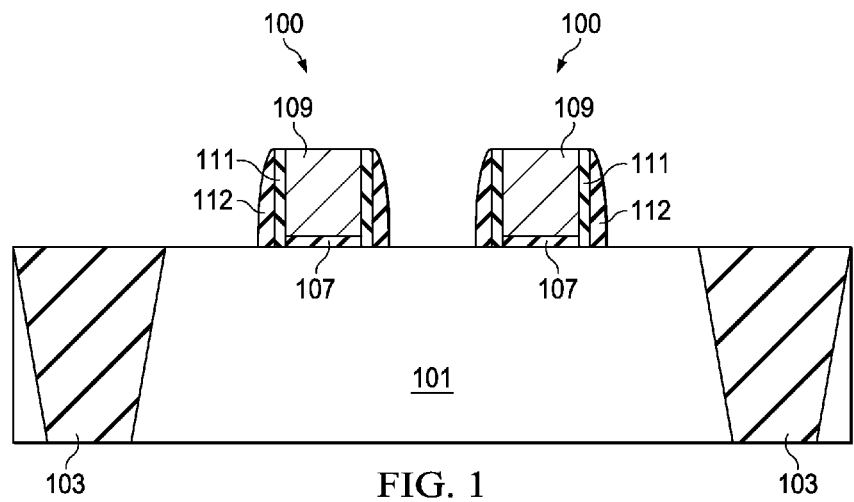
FIG. 1 illustrates a substrate with gate stacks on the substrate in accordance with an embodiment.

With reference now to FIG. 1, there are shown two gate stacks 100 formed on a substrate 101 with isolation regions 103 formed therein. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The STIs 103 may be formed by etching the substrate 101 to form a trench and filling the trench with a dielectric material as is known in the art. For example, the STIs 103 may be filled with a dielectric material such as an oxide material, a high-density plasma (HDP) oxide, or the like, formed by methods known in the art.

The gate stacks 100 may comprise gate dielectrics 107, gate electrodes 109, first spacers 111, and second spacers 112. The gate dielectrics 107 may be a dielectric material, such as silicon oxide, silicon oxynitride, silicon nitride, an oxide, a nitrogen-containing oxide, a combination thereof, or the like. The gate dielectrics 107 may have a relative permittivity value greater than about 4. Other examples of such materials include aluminum oxide, lanthanum oxide, hafnium oxide, zirconium oxide, hafnium oxynitride, or combinations thereof.

In an embodiment in which the gate dielectrics 107 comprise an oxide layer, the gate dielectrics 107 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In an embodiment, the gate dielectrics 107 may be between about 8 Å to about 200 Å in thickness.

The gate electrodes 109 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like. In an embodiment in which the gate electrodes 109 are poly-silicon, the gate electrodes 109 may be formed by depositing doped or undoped poly-silicon by low-pressure chemical vapor deposition (LPCVD) to a thickness in the range of about 400 Å to about 2,400 Å, such as about 1,400 Å.

Once the gate dielectrics 107 and the gate electrodes 109 have been formed, the gate dielectrics 107 and gate electrodes 109 may be patterned. In an embodiment, the gate dielectrics 107 and the gate electrodes 109 may be patterned using, e.g., a photolithographic masking and etching process, whereby a photolithographic mask (not shown in FIG. 1) is formed over the gate electrodes 109 and then exposed to a patterned light.

After exposure, desired portions of the photolithographic mask are removed to exposed the underlying gate electrodes 109, which may then be etched to remove the exposed portions, thereby patterning the gate electrodes 109 and the gate dielectrics 107.

The first spacers 111 and the second spacers 112 may be formed by blanket depositing one or more spacer layers (not shown) over the gate electrodes 109 and the substrate 101. The spacer layers may comprise SiN, oxynitride, SiC, SiON, oxide, and the like and may be formed by commonly used methods such as chemical vapor deposition (CVD), plasma enhanced CVD, sputter, and other methods known in the art. The spacer layers may be patterned, such as by isotropically or anisotropically etching, thereby removing the spacer layers from the horizontal surfaces of the structure and forming the first spacers 111 and the second spacers 112 as illustrated in FIG. 1.

However, as one of ordinary skill in the art will recognize, the process described above and the resulting shape of the first spacers 111 and the second spacers 112 as illustrated in FIG. 1 are intended to be merely illustrative and are not intended to limit the embodiments to these descriptions. Rather, any suitable number and combination of spacers layers and shapes may be utilized in order to form spacers for the gate stack 105, and any suitable combination of spacers may alternatively be utilized.

Figure 2:
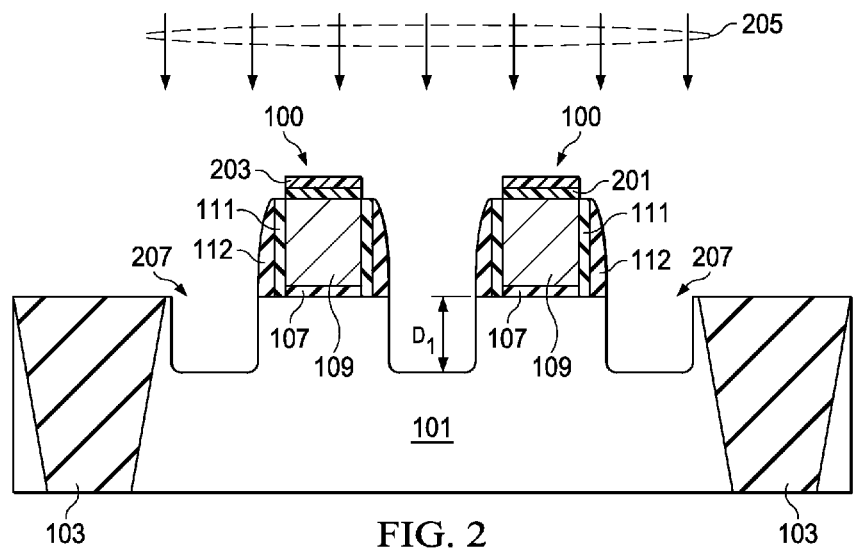
FIG. 2 illustrates the formation of openings within the substrate in accordance with an embodiment.

FIG. 2 illustrates a removal of a portion of the substrate 101 utilizing hardmasks 201, photoresists 203, the first spacers 111, and the second spacers 112 as masks. In an embodiment a hardmask layer (not shown in FIG. 2) may be blanket deposited over the substrate 101 and the gate stacks 100 through a process such as CVD. The hardmask layer may be formed of a material that resists etching from the etchant 627 chosen to etch the substrate 101 (described further below with respect to FIG. 3). In an embodiment, the hardmask layer may be formed of a material such as silicon nitride, although any other suitable material may alternatively be utilized for the hardmask layer.

Once formed, the hardmask layer may be patterned using, e.g., a photolithographic etch process. In an embodiment, the hardmask layer may be patterned to form the hardmasks 201 using, e.g., a photolithographic masking and etching process, whereby a photolithographic mask 203 is formed over the hardmask layer and then exposed to a patterned light. After exposure, desired portions of the photolithographic mask are removed to expose the underlying hardmask layer, which may then be etched to remove the exposed portions, thereby patterning the hardmask layer into the hardmasks 201 with overlying photoresists 203.

Once the hardmasks 201 have been formed over the gate stacks 100, a first etch 205 of the substrate 101 may be performed using the hardmasks 201, the photoresists 203, the first spacers 111, and the second spacers 112 as masks. The first etch 205 may be, e.g., an anisotropic etch such as a reactive ion etch (RIE) utilizing an etchant such as a mixture of $SF_2$ and oxygen, although any other suitable etching process may alternatively be utilized. In an embodiment the first etch 205 may be used to form openings 207 or recesses within the substrate 101 with a "U" shape to a first depth $D_1$ from a surface of the substrate 101 of between about 50 nm and about 80 nm, such as about 64 nm.

Figure 3:
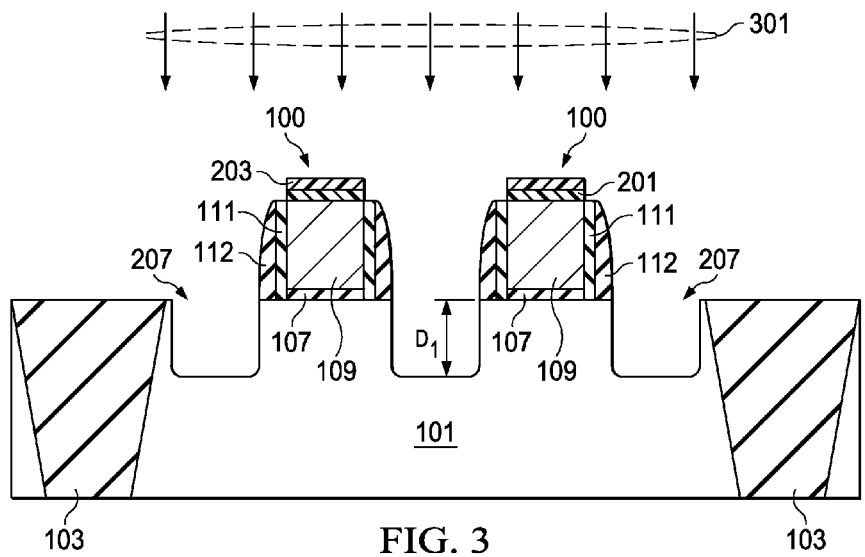
FIG. 3 illustrates an ion implantation into the substrate in accordance with an embodiment.

FIG. 3 illustrates an ion implantation 301 that may be performed into the substrate 101 using the hardmasks 201, the first spacers 111, and the second spacers 112 as masks. In an embodiment ions may be implanted into the substrate 101 using, e.g., an ion implantation process, although any other suitable method for introducing ions into the substrate 101 through the openings 207 may alternatively be utilized. In an embodiment in which the substrate 101 is an n-type substrate, the ion implantation 301 may implant appropriate p-type dopants such as boron, gallium, indium, or the like. Alternatively, in an embodiment in which the substrate 101 is a p-type substrate, the ion implantation 301 may implant appropriate n-type dopants such as phosphorous, arsenic, or the like. The ion implantation 301 may implant the ions into the substrate 101 to a concentration of between about 10E1 and about 10E5, such as about 10E3.

Figure 4:
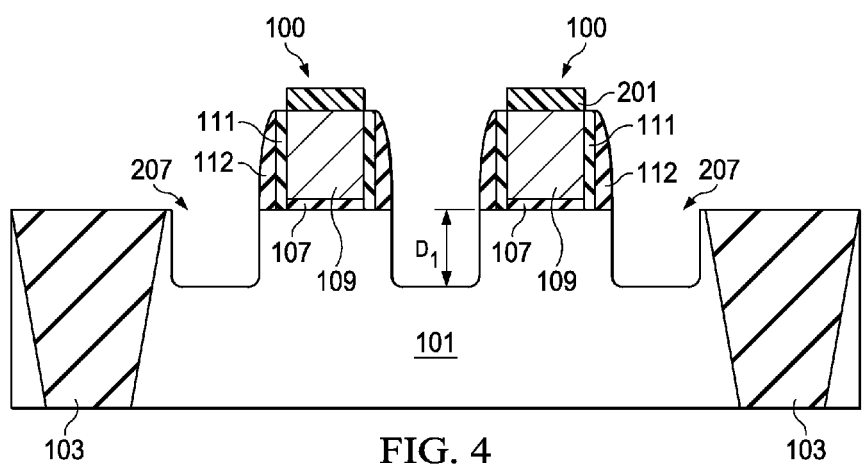
FIG. 4 illustrates the removal of the photoresist from the hardmasks in accordance with an embodiment.

FIG. 4 illustrates a removal of the photoresists 203 from the hardmasks 201. In an embodiment the removal of the photoresist 203 may be performed by an ashing process in which the photoresist 203 may be exposed to an oxygen plasma and heated to a temperature sufficient to thermally degrade the photoresist 203, such as about 150° C. to about 250° C. However, any other suitable removal process may alternatively be utilized to remove the photoresist 203.

Optionally, a first clean may be performed on the substrate 101 after the removal of the photoresist 203 in order to remove any leftover organic contamination that may remain on the substrate 101 or the gate stacks 100 after the removal of the photoresist 203. In an embodiment the first clean may be, e.g., a CARO clean, in which the substrate 101 may be exposed to a solution of sulfuric acid and hydrogen peroxide. However, this description is intended to be merely illustrative, as any other suitable method and materials, such as a mixture of sulfuric acid and ozone, may alternatively be utilized to provide a first clean to the substrate 101 after the removal of the photoresist 203.

Figure 5:
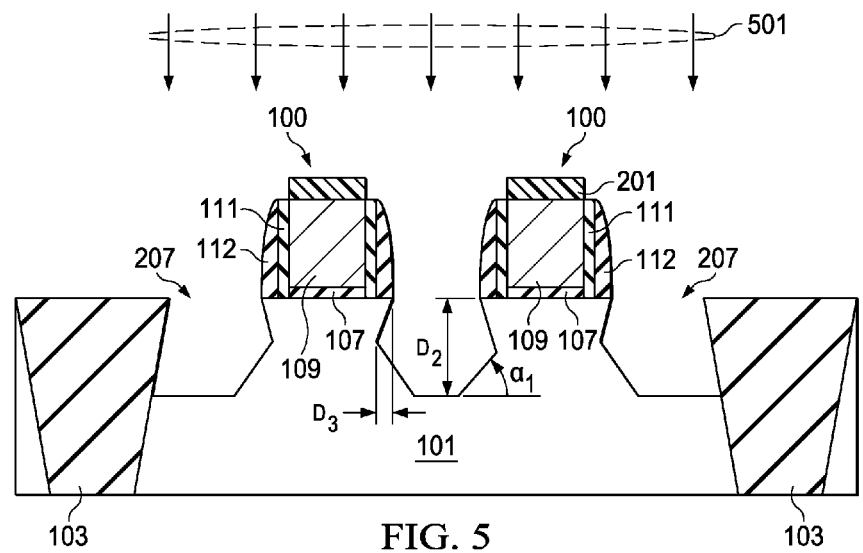
FIG. 5 illustrates a second etch of the openings in the substrate in accordance with an embodiment.

FIG. 5 illustrates a second etch 501 that may be performed to widen the openings 207 in the substrate 101. In an embodiment the second etch 501 may be utilized to transform the openings 207 from the "U" shape as illustrated in FIG. 2 to a "V" shape, thereby undercutting the first spacers 111 and the second spacers 112. In an embodiment the second etch 501 may expand the openings 207 such that the openings 207 extend into the substrate 101 a second distance $D_2$ of between about 50 nm and about 90 nm, such as about 78 nm, and may undercut the first spacers 111 and the second spacers 112 a third distance $D_3$ of between about 6 nm and about 18 nm, such as about 12 nm. Additionally, the openings 207 may be formed to have an angle $\alpha_1$ of between about 50° and about 60°, such as about 55°.

Figure 6B:
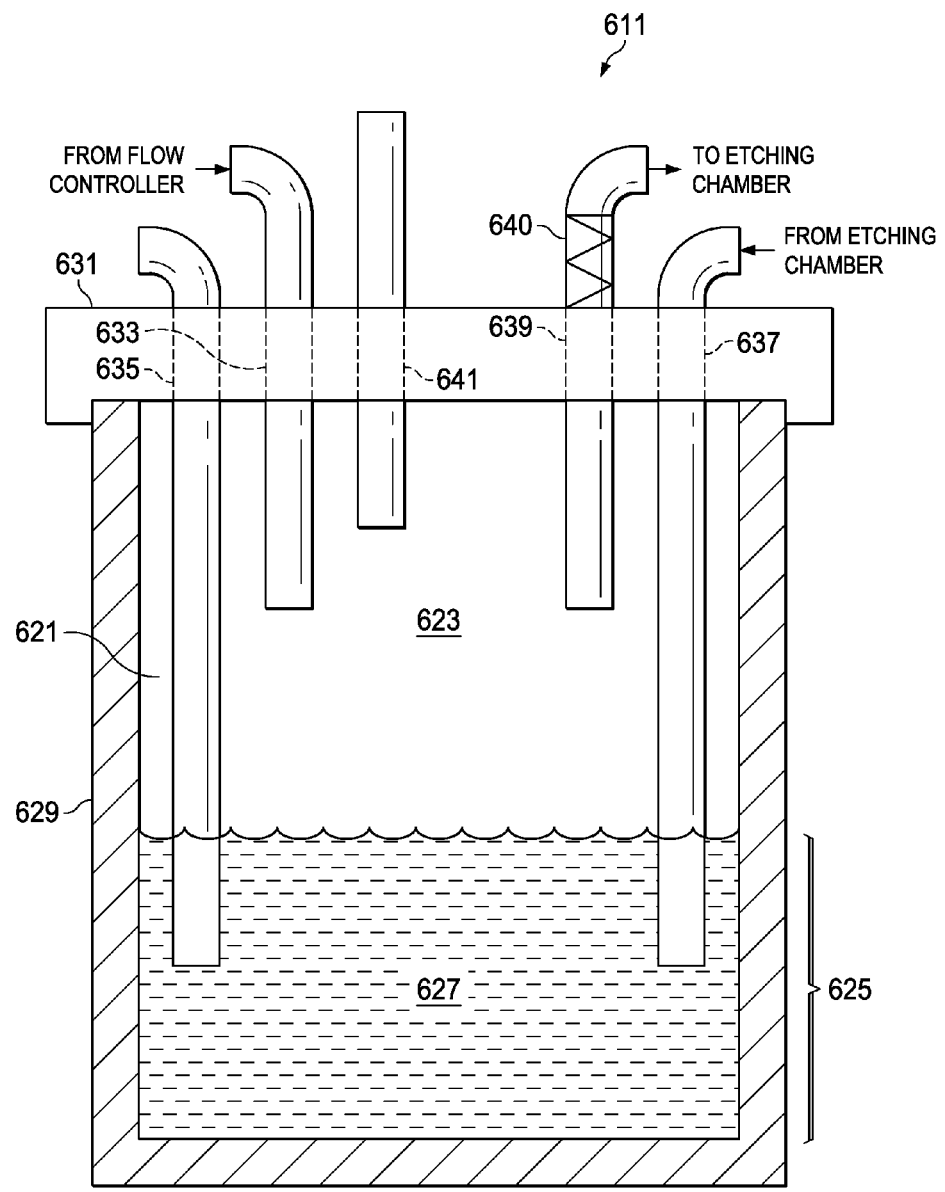

To begin the second etch 501, the substrate 101 (along with the structures on the substrate 101) may be placed into an etching system 601 such as, e.g., the etching system 601 illustrated in FIG. 6A, which may comprise an etchant delivery system 603 that may deliver a liquid etchant 627 (not shown in FIG. 6A but illustrated and discussed below with respect to FIG. 6B) to an etching chamber 604. The etchant delivery system 603 supplies the etchant 627 to the etching chamber 102 through an etchant controller 613 and a manifold 605. The etchant delivery system 603 may also help to control the flow rate of the etchant 627 into the etching chamber 604 by controlling the flow and pressure of a carrier gas through the etchant delivery system 603. Furthermore, while only a single etchant delivery system 603 is illustrated in FIG. 6A, this is done for simplicity, as more than one etchant delivery system 603 may be connected to the etching chamber 604 in order to provide any number and type of etchants desired for the manufacturing process.

In an embodiment the etchant delivery system 603 may include a carrier gas supply 607, a flow controller 609, and an etchant canister 611. The carrier gas supply 607 may supply a carrier gas that may be used to help push or "carry" the etchant 627 to the etching chamber 604. The carrier gas may be an inert gas or other gas that does not react with the etchant 627 itself or with by-products from the etchant's 627 reaction with the substrate 101. In an embodiment, the carrier gas may be a gas that is free from carbon dioxide, which may react in undesired side reactions to form particle defects on the substrate 101. For example, the carrier gas may be nitrogen ($N_2$), helium (He), argon (Ar), combinations of these, or the like, although other suitable carrier gases may alternatively be utilized. Alternatively, the carrier gas may be a gas that is substantially free of potential reactants, such as carbon dioxide, wherein the concentration of the potential reactant in the carrier gas may be less than about 1 vol %.

The carrier gas supply 607 may be a vessel, such as a gas storage tank, that is located either locally to the etching chamber 604 or remotely from the etching chamber 604. Alternatively, the carrier gas supply 607 may be a facility that independently prepares and delivers the carrier gas to the flow controller 609 of the etchant delivery system 603 and elsewhere, such as other etchant delivery systems (not separately shown). Any suitable source for the carrier gas may be utilized as the carrier gas supply 607, and all such sources are fully intended to be included within the scope of the embodiments.

The carrier gas supply 607 may supply the desired carrier gas to the flow controller 609 through a first line 610. The flow controller 609 may be utilized to control the flow of the carrier gas to the etchant canister 611 and, eventually, to the etching chamber 604. The flow controller 609 may be, e.g., a proportional valve, a modulating valve, a needle valve, a pressure regulator, a mass flow controller, combinations of these, or the like. However, any suitable method for controlling and regulating the flow of the carrier gas to the etching chamber 604 may be utilized, and all such methods are fully intended to be included within the scope of the embodiments. In an embodiment the carrier gas supply 607 may control the flow of carrier gas to between about 1 L/min and about 500 L/min, such as about 200 L/min.

The flow controller 609 may supply the controlled carrier gas to the etchant canister 611 through a second line 612. The etchant canister 611 may be utilized to supply the etchant 627 to the etching chamber 604 and may be located between a first valve 614 and a second valve 616 that may be used to isolate the etchant canister 611 from inflowing and outflowing streams. By isolating the etchant canister 611 from the process streams, the etchant canister 611 may be removed from the process, either physically or functionally, so that maintenance or other off-line work may be performed on the etching canister 107 while it is not actively connected to the rest of the etchant delivery system 603. A third valve 618 may be connected between the second valve 616 and the etching chamber 604 in order to make sure that atmospheric gases do not enter the etching chamber 604 while the etchant canister 611 has been removed.

FIG. 6B illustrates in greater detail the etchant canister 611 between the flow controller 609 and the etching chamber 604. The etchant canister 611 may comprise a chamber 621 with a vapor region 623 and an etchant region 625. The chamber 621 may be any desired shape that may be suitable for containing the etchant 627. In the embodiment illustrated in FIG. 7, the chamber 621 has a cylindrical sidewall and a bottom. However, the chamber 621 is not limited to a cylindrical shape, and any other suitable shape, such as a hollow square tube, an octagonal shape, or the like, may alternatively be utilized. Furthermore, the chamber 621 may be surrounded by a housing 629 made of material that is inert to the etchant 627. As such, while the housing 629 may be any suitable material that can withstand the chemistries and pressures involved in the process, in an embodiment the housing 629 may be steel, stainless steel, nickel, aluminum, alloys of these, combinations of these, and like.

The chamber 621 may also have a lid 631 to enclose the chamber 621. The lid 631 may be attached to the housing 629 utilizing, e.g., a seal such as an o-ring, a gasket, or other sealant in order to prevent leakage from the chamber 621 while at the same time allowing the lid 631 to be removed for access to the chamber 621 within the interior of the housing 629. Alternatively, the lid 631 may be attached by welding, bonding, or adhering the lid 631 to the housing 629 in order to form an air-tight seal and prevent any leakage.

A first inlet port 633, a second inlet port 635, a third inlet port 637, a first outlet port 639, and a second outlet port 641 may provide access into and out of the chamber 621 through the lid 631. In an embodiment the first inlet port 633 may be used to receive the carrier gas from the flow controller 609 (see FIG. 6A) and the first outlet port 639 may be used to output the etchant 627 to the etching chamber 604. The second inlet port 635 may be used to introduce fresh make-up etchant 627 to the etchant region 625 as needed during the etching process or else between etching processes, while the third inlet port 637 may receive recycled etchant 627 from the etching chamber 604. Finally, the second outlet port 641 may be used as an exhaust port to exhaust vapor from the vapor region 623 as needed.

The first inlet port 633, the second inlet port 635, the third inlet port 637, the first outlet port 639, and the second outlet port 641 may be formed in the lid 631 of the chamber 621 (as illustrated in FIG. 6B) or may alternatively be formed through the sidewalls of the chamber 621. In an embodiment the first inlet port 633, the second inlet port 635, the third inlet port 637, the first outlet port 639, and the second outlet port 641 may also include a particle trap 640 and other various valves and fittings (not shown in FIG. 6B for clarity) to facilitate removal and replacement of the chamber 621.

The etchant region 625 may be utilized to store and prepare the etchant 627 before the etchant 627 is transported to the etching chamber 604. The etchant 627 may be any suitable reactant that may be used to chemically react and remove the substrate 101. In an embodiment in which the substrate 101 is silicon, the etchant 627 may a liquid reactant such as, e.g., tetramethyl ammonium hydroxide (TMAH), although any other suitable etchant 627, such as monoethanolamine (MEA); tetraethylammonium hydroxide (TEAH); tetra-n-butylammonium hydroxide (TBAH); ammonium hydroxide; imidazole; 1H-tetetrazole; 1,2,4-1H-triazole, 1,2,3-1H-triazole; mixtures of these; or the like, may also be utilized.

Once the etchant 627 has been placed into the etchant region 625 of the etching chamber 604, the carrier gas controller 609 may introduce the carrier gas into the etchant canister 611. During use the pressure from the carrier gas will apply a downward force from the vapor region 623 onto the etchant 627, which is in a liquid form in the etchant region 625. This pressure will push the etchant 627 through the first outlet port 639 and towards the etching chamber 604. Additionally, the contact between the carrier gas and the etchant 627 will cause at least a portion of the carrier gas to be absorbed by the etchant 627.

Returning now to FIG. 6A, once the etchant 627 has been placed into the etchant canister 611, the second etch 501 (see FIG. 5) may be started by the etchant controller 613 connecting the etchant delivery system 603 to the etching chamber 604 and directing the etchant 627 (pushed by the carrier gas) through the manifold 605, into the etching chamber 604, and to a showerhead 643. The showerhead 643 may be utilized to disperse the etchant 627 into the etching chamber 604 and may be designed to evenly disperse the etchant 627 in order to minimize undesired process conditions that may arise from uneven dispersal. In an embodiment the showerhead 643 may have a circular design with openings dispersed evenly around the showerhead 643 to allow for the dispersal of the etchant 627 into the etching chamber 604.

However, as one of ordinary skill in the art will recognize, the introduction of the etchant 627 into the etching chamber 604 through a single showerhead 643 or through a single point of introduction as described above is intended to be illustrative only and is not intended to be limiting to the embodiments. Any number of separate and independent showerheads 643 or other openings to introduce the etchant 627 into the etching chamber 604 may alternatively be utilized. All such combinations of showerheads and other points of introduction are fully intended to be included within the scope of the embodiments.

The etching chamber 604 may receive the etchant 627 and expose the etchant 627 to the substrate 101, and the etching chamber 604 may be any desired shape that may be suitable for dispersing the etchant 627 and contacting the etchant 627 with the substrate 101. In the embodiment illustrated in FIG. 6A, the etching chamber 604 has a cylindrical sidewall and a bottom. However, the etching chamber 604 is not limited to a cylindrical shape, and any other suitable shape, such as a hollow square tube, an octagonal shape, or the like, may alternatively be utilized. Furthermore, the etching chamber 604 may be surrounded by an etchant chamber housing 615 made of material that is inert to the various process materials. As such, while the etchant chamber housing 615 may be any suitable material that can withstand the chemistries and pressures involved in the etching process, in an embodiment the etchant chamber housing 615 may be steel, stainless steel, nickel, aluminum, alloys of these, combinations of these, and like.

Within the etching chamber 604 the substrate 101 may be placed on a mounting platform 645 in order to position and control the substrate 101 during the second etch 501. The mounting platform 645 may hold the substrate 101 using a combination of clamps and vacuum pressure, and may also include heating mechanisms (not shown) in order to heat the substrate 101 during the etching process. Furthermore, while a single mounting platform 645 is illustrated in FIG. 6A, any number of mounting platforms 645 may additionally be included within the etching chamber 604 in order to etch multiple substrates 101 during a single etching process.

Additionally, the etching chamber 604 and the mounting platform 645 may be part of a cluster tool system (not shown). The cluster tool system may be used in conjunction with an automated handling system in order to position and place the substrate 101 into the etching chamber 604 prior to the second etch 501, position and hold the substrate 101 during the second etch 501, and remove the substrate 101 from the etching chamber 604 after the second etch 501.

The etching chamber 604 may also have an outlet 647 for used etchant 627 to exit the etching chamber 604. The used etchant 627 may be discarded or, as illustrated in FIG. 6A, the used etchant 627 may be recycled and returned to the etchant canister 611 to be reused in a subsequent etching process. If desired, the used etchant 627 may be treated such as by filtering or reactivation prior to its return to the etchant canister 611.

During the second etch 501, the etchant 627 (e.g., TMAH) is pushed by the carrier gas from the etchant canister 611 through the manifold 605 and the showerhead 643 to contact the substrate 101. Additionally, because the etchant 627 is in contact with the carrier gas, at least a portion of the carrier gas will be absorbed within the etchant 627 and be carried by the etchant 627 into the etching chamber 604 to contact the substrate 101 along with the etchant 627. However, because the carrier gas does not contain carbon dioxide or any other components that may react with the etchant 627, the substrate 101, or any of the by-products from the second etch 501, the carrier gas will be inert to the chemical reactions that may occur.

Figure 7:
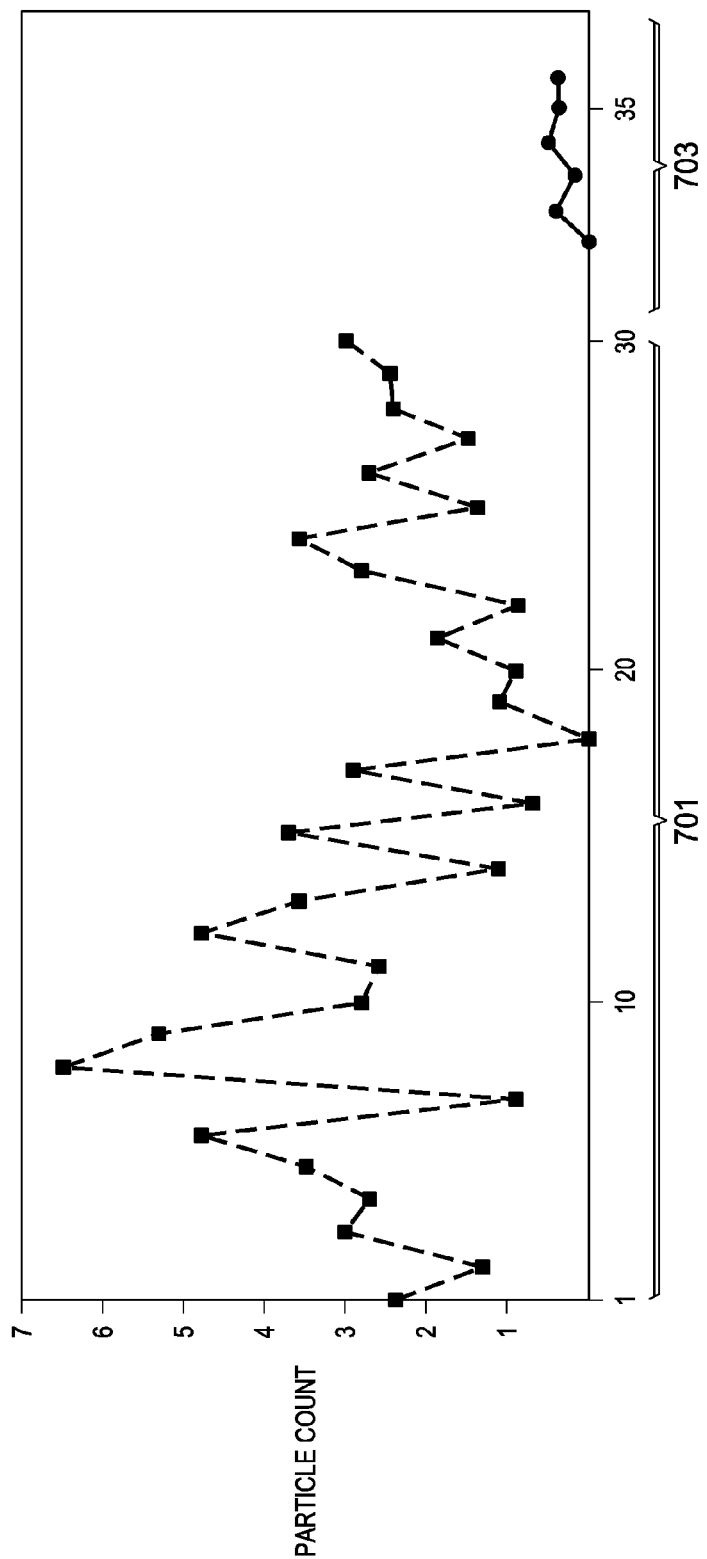
FIGS. 7, 8, and 9A-9B illustrate the benefits of utilizing an inert carrier gas in accordance with an embodiment.

By using inert gases as the carrier gas, potential reactants (e.g., carbon dioxide) may be removed and multiple benefits may be obtained for the process containing the second etch 501. One such benefit is illustrated in FIG. 7, which illustrates a count of particles (which may be considered as defects) that occur during an etching process such as the second etch 501 described above with respect to FIGS. 5-6B. In FIG. 7, where the x-axis merely illustrates the relative wafer number for the particle count, a first region 701 illustrates particle counts that occur when air (including carbon dioxide) is utilized as the carrier gas, is partially absorbed by the etchant 627, and is carried into the etching chamber 604 with the etchant 627, thereby being available as a reactant. When this occurs, it is believed that the carbon dioxide in the air will react in the manner indicated by Chemical Equations 1-6 to form precipitates and cause particle defects:

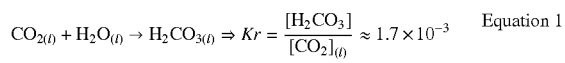

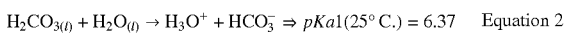

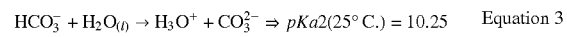

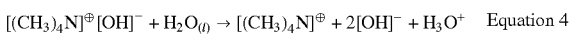

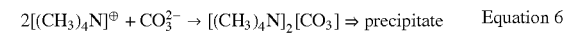

However, when an inert carrier gas such as nitrogen is utilized, the carbon dioxide is unavailable as a reactant. Results from etching processes utilizing $N_2$ are illustrated in a second region 703 of FIG. 7. As illustrated, the particle count using nitrogen as the carrier gas is reduced from the count of particles using air (including carbon dioxide) as the carrier gas. For example, the average particle count when nitrogen is used is about 20 ea, while the average particle count when air is used is about 60 ea.

Additionally, beyond simply reducing the number of particle defects, the removal of reactive components from the carrier gas also provides a more stable etching rate for the second etch 501. In an embodiment in which the substrate 101 is silicon, the etchant 627 is TMAH, and the carrier gas is $N_2$ instead of air, the variation in etch depth between etching processes may be lessened by using $N_2$ instead of air. By lessening the variation of the second etch 501, greater control of the process may be obtained, and more consistent etching processes may be obtained.

Figure 8:
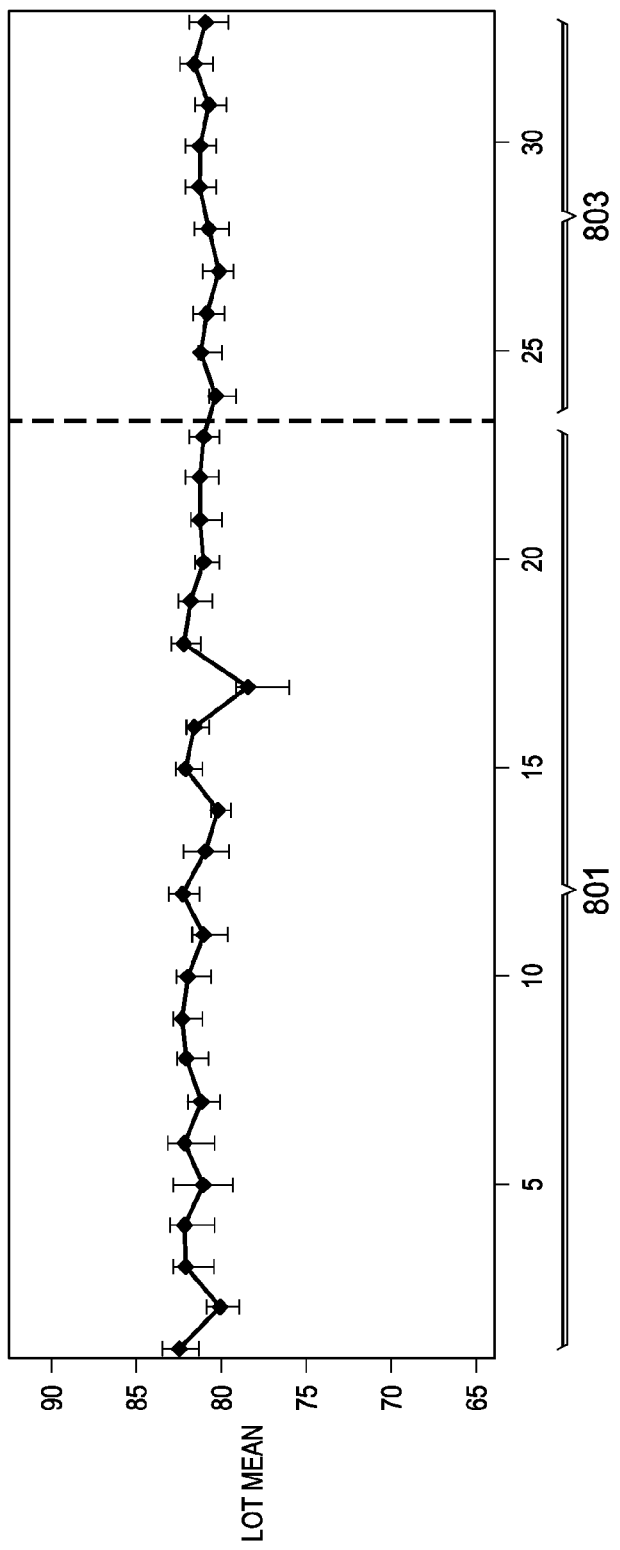

FIG. 8 illustrates this result, in which an on-line analysis was performed of the variation in etching depth between etches where air was utilized as the carrier gas etches where $N_2$ was utilized as the carrier gas, wherein the x-axis represents the relative number of the wafers to which the data along the y-axis relates. In FIG. 8 a third region 801 illustrates a lot mean variation in etching depth that occurs while utilizing air as the carrier gas, and a fourth region 803 illustrates a lot mean variation in etching depth that occurs while utilizing $N_2$ as the carrier gas. From these results, the sigma variation in depth may be reduced from about 0.93 nm (using air as the carrier gas) to about 0.41 nm (using $N_2$ as the carrier gas).

Figure 9A:
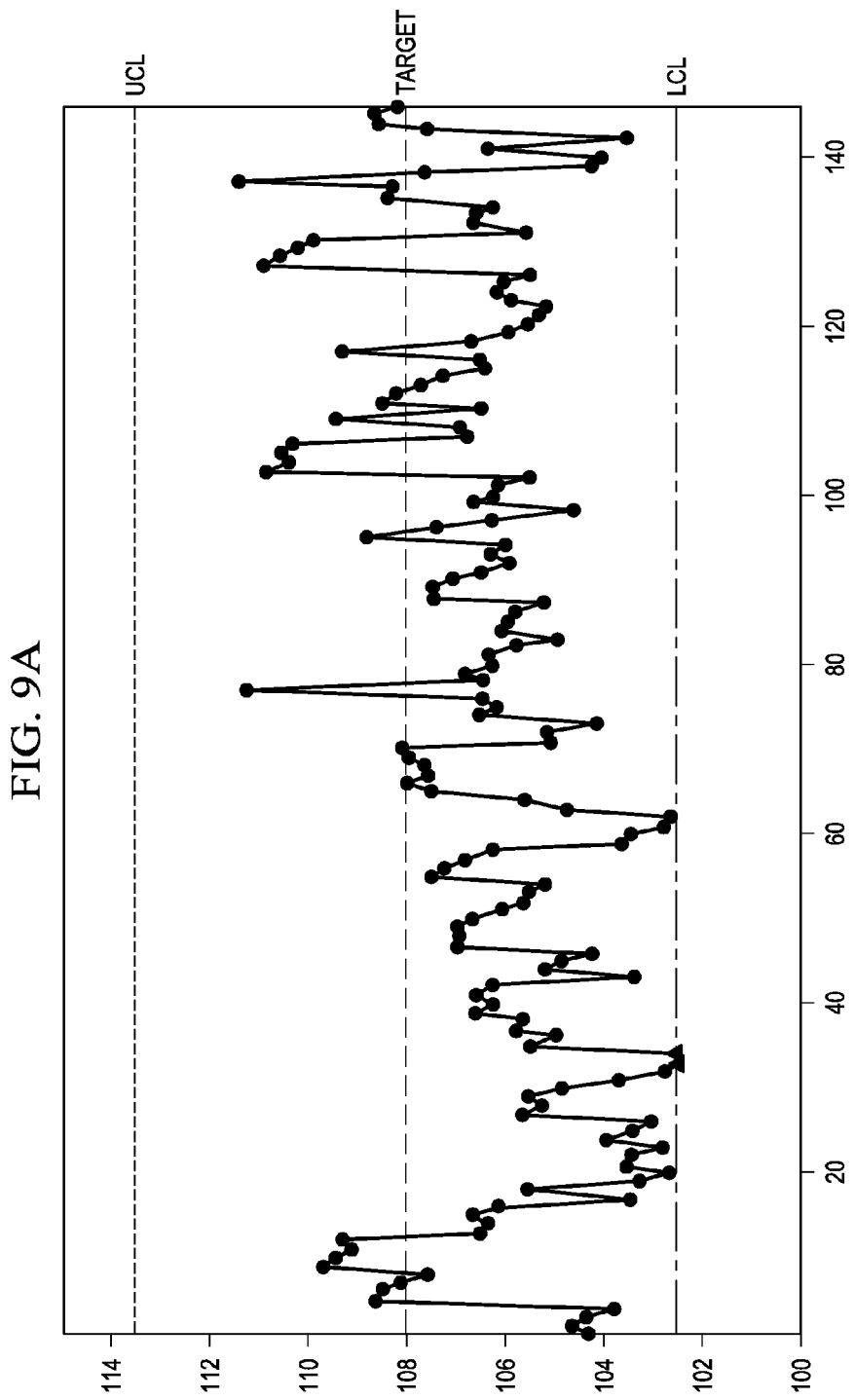
Figure 9B:
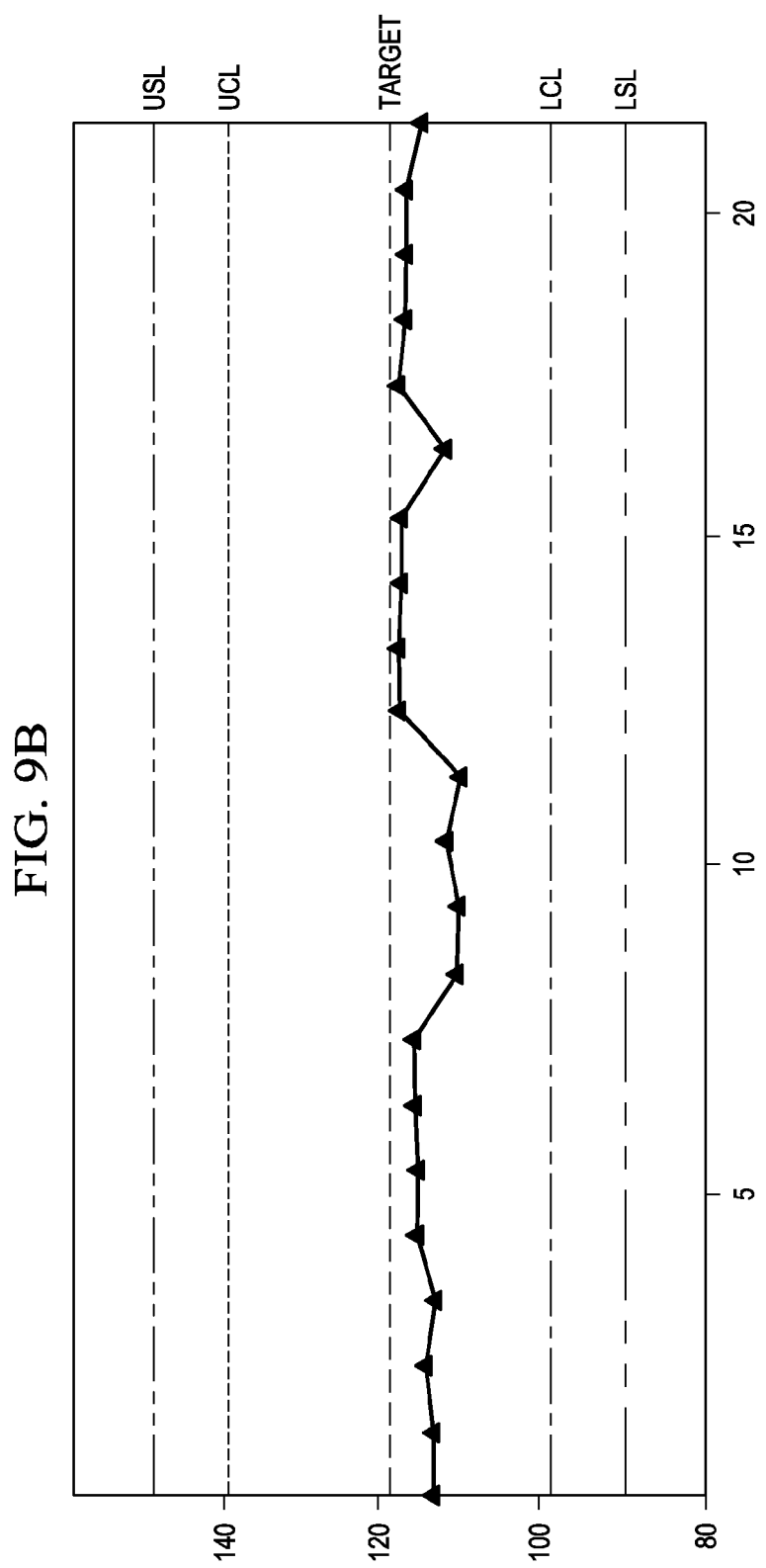

FIGS. 9A-9B also illustrate a reduction in the variation of etch depth when nitrogen is utilized as the carrier gas, wherein the x-axis in both FIG. 9A and FIG. 9B represents the relative number of the wafer to the wafers to which the data along the y-axis relates. In these figures FIG. 9A illustrates off-line variation data obtained using air as the carrier gas while FIG. 9B illustrates on-line variation data obtained using $N_2$ as the carrier gas. As illustrated in FIG. 9A, the variation in the etch depth obtained using air as the carrier gas may have a variation of about 4.75 Å, while the variation in etch depth obtained by using $N_2$ as the carrier gas (as illustrated in FIG. 9B), may be about 0.35 Å. As such, using a non-reactive carrier gas such as nitrogen may not only reduce the number of particle defects formed by the second etch 501 but may also provide a greater control over the second etch 501, leading to less variation between separate etching processes.

Figure 10:
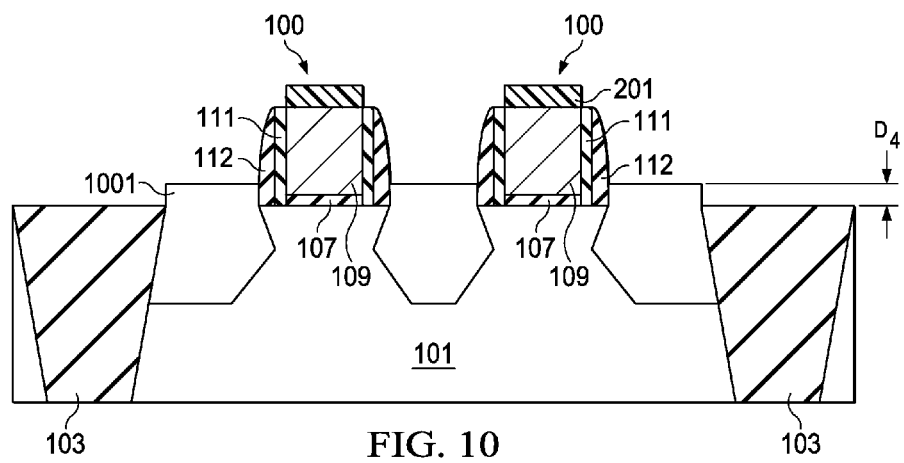
FIG. 10 illustrates the filling of the openings in the substrate with a semiconductor material.

FIG. 10 illustrates the formation of a semiconductor material 1001 into the openings 207 of the substrate 101. Optionally, prior to the formation of the semiconductor material 1001, a second clean may be performed to clean the openings 207. In an embodiment, the second clean may include a Standard Clean (SC)-1/SC-2 cleaning process, in which the substrate 101 is first exposed to a solution of ammonium hydroxide ($NH_4OH$), hydrogen peroxide ($H_2O_2$), and water to form a thin oxide on the exposed substrate 101, which may then be removed using a solution of hydrogen fluoride (HF) and water. Next, the substrate 101 may be exposed to a solution of hydrochloric acid (HCl), hydrogen peroxide ($H_2O_2$) and water to form another thin oxide, which may then be removed using a solution of diluted HF in water.

Additionally, the second clean may also utilize a $NH_4OH$/$HF$/$H_2O$/Surfactant (TBE) cleaning process. In this cleaning process the exposed substrate 101, after being exposed to the diluted HF in water, may be cleaned with another solution such as $NH_4OH$/$H_2O_2$/$H_2O$ or $HCl$/$H_2O_2$/$H_2O$. This combination of cleaning processes (SC-1/SC-2 along with the TBE cleaning process) help to clean the substrate 101 and prepare it for further processing. However, the embodiments described herein for the second clean are not intended to be limiting to the embodiments, as any other suitable cleaning process may alternatively be utilized.

Once the openings 207 have been cleaned by the second clean, the semiconductor material 1001 may be formed within the openings 207 to form source/drain regions for the gate stacks 100. In an embodiment the semiconductor material 1001 may be silicon germanium, although any other suitable semiconductor materials, such as silicon, silicon carbide, or the like, may alternatively be utilized. Additionally, the semiconductor material 1001 may be formed utilizing a process such as plasma enhanced chemical vapor deposition (PECVD) utilizing Si-containing and Ge-containing precursor materials such as $SiH_4$ and $GeH_4$, respectively. The semiconductor material 1001 may be doped in-situ as it is being formed or else separately doped in order to form source/drain regions for the gate stacks 100. In an embodiment the semiconductor material 1001 may be formed such that it extends above a top surface of the substrate 101 a fourth distance $D_4$ of between about 0 nm and about 40 nm, such as about 2 nm.

Figure 11:
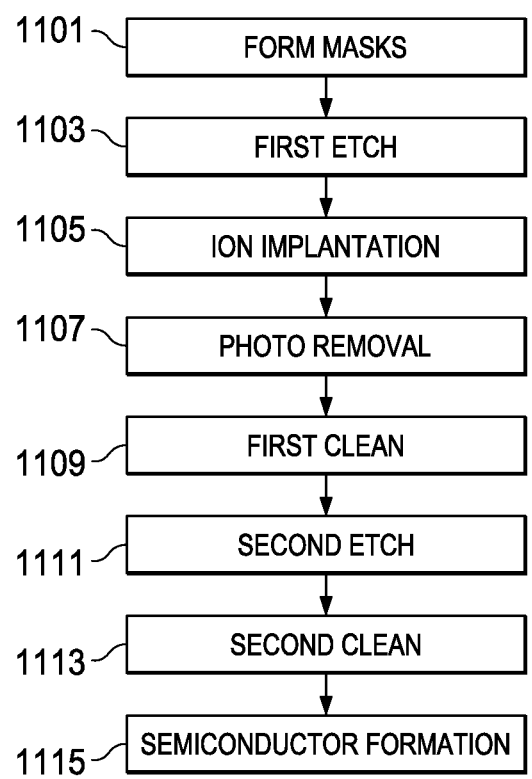
FIG. 11 illustrates a process flow for etching the substrate and filling the openings in accordance with an embodiment.

FIG. 11 illustrates a summary of process steps in one embodiment that may utilize the non-reactive carrier gas for the etching process. In a first step 1101, the hardmasks 201 and photoresists 203 are formed and patterned and in a second step 1103 a first etch is performed on the substrate 101 to form the openings 207 in the substrate. In a third step 1105 ions may be implanted into the substrate 101, and the photoresists 203 may be removed in a fourth step 1107. After the photoresists 203 have been removed, a first clean may be performed on the wafer in a fifth step 1109, and a second etch may be performed on the wafer is a sixth step 1111, wherein the second etch utilizes a non-reactive carrier gas. A second clean may be used to clean the substrate 101 in a seventh step 1113, and a semiconductor material 1001 may be formed within the openings 207 in an eighth step 1115.

In accordance with an embodiment a method for manufacturing a semiconductor device comprising introducing an etchant to a substrate to form a recess in the substrate, wherein the introducing the etchant uses a carrier gas that is free from carbon dioxide, wherein the substrate is a semiconductor material, and wherein the etchant is in a liquid phase, is provided. The etchant is removed from the substrate.

In accordance with another embodiment a method of manufacturing a semiconductor device comprising placing a liquid etchant into an etchant container is provided. A carrier gas is introduced into the etchant container to carry the liquid etchant into an etching chamber, wherein the carrier gas is chemically inert to both the etchant and any by-products from a reaction between the etchant and the substrate. The etchant is dispersed onto a substrate to remove a portion of the substrate, wherein the substrate is a semiconductor material.

In accordance with yet another embodiment a method of manufacturing a semiconductor device comprising etching a recess into a semiconductor material of a substrate is provided. Nitrogen is introduced to an etchant canister, the etchant canister holding a liquid etchant, and the liquid etchant is pushed to a showerhead using the nitrogen. The liquid etchant is dispersed onto the semiconductor material of the substrate, thereby widening the recess with the etchant.

Although the embodiments and their advantages have been described in detail, it should be understood that various changes, substitutions and alterations can be made herein without departing from the spirit and scope of the embodiments as defined by the appended claims. For example, the precise etchants and carrier gases that may be utilized may be modified. Additionally, the precise conditions of the various processes utilized may be modified while still remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method for manufacturing a semiconductor device, the method comprising:
    forming a first opening in a substrate with a first bottom, wherein the forming the first opening is performed with a photoresist mask located over a gate electrode and wherein the substrate comprises first dopants with a first conductivity;
    implanting second dopants into the first opening, wherein the second dopants have a second conductivity opposite from the first conductivity;

removing the photoresist mask after the implanting the second dopants;
introducing an etchant to the substrate along sidewalls of the first opening after the implanting the second dopants into the first opening and after the removing the photoresist mask to form a recess in the substrate, wherein the introducing the etchant uses a carrier gas to generate a liquid stream that is substantially free from carbon dioxide, wherein the substrate is a semiconductor material, and wherein the etchant is in a liquid phase, wherein the recess has a second bottom that is at least 10 nm further from a major surface of the substrate than the first bottom; and
removing the etchant from the substrate.

2. The method of claim 1, wherein the introducing the etchant further comprises introducing the carrier gas to an etchant canister.

3. The method of claim 1, wherein the etchant is tetra-methyl ammonium hydroxide.

4. The method of claim 3, wherein the carrier gas is nitrogen.

5. The method of claim 1, further comprising forming a gate stack on the substrate prior to the introducing the etchant.

6. The method of claim 1, further comprising filling the recess with a semiconductor material.

7. The method of claim 6, wherein the semiconductor material is silicon germanium.

8. The method of claim 1, wherein the implanting the second dopants into the first opening implants the second dopants to a concentration of between about 10E1 and about 10E5.

9. A method of manufacturing a semiconductor device, the method comprising:
forming an opening aligned with a first spacer, wherein the first spacer is adjacent to a gate electrode with a photoresist over the gate electrode, the opening having a first bottom surface;
implanting a p-type or an n-type dopant into the opening;
removing the photoresist after the implanting the p-type or n-type dopant;
placing a liquid etchant into a bottom portion of an etchant container;
introducing a carrier gas into a top portion of the etchant container to push a top surface of the liquid etchant towards a bottom of the etchant container and carry the liquid etchant into an etching chamber, wherein the carrier gas is chemically inert to both the etchant and any by-products from a reaction between the etchant and a substrate; and
dispersing the etchant onto the substrate to contact a portion of the first spacer and to remove a portion of a sidewall and the first bottom surface of the opening, wherein the substrate is a semiconductor material and the removing the portion of the sidewall and the first bottom surface of the opening is performed after the removing the photoresist and also forms a second bottom surface of the opening at least 10 nm further into the substrate than the first bottom surface.

10. The method of claim 9, wherein the carrier gas is nitrogen.

11. The method of claim 9, wherein the etchant is tetra-methyl ammonium hydroxide.

12. The method of claim 9, wherein the carrier gas is nitrogen and the etchant is tetra-methyl ammonium hydroxide.

13. The method of claim 9, wherein the dispersing the etchant widens the opening into the substrate.

14. The method of claim 13, further comprising filling the opening with a semiconductor material, wherein the semiconductor material extends above a major surface of the substrate after the filling the opening.

15. The method of claim 9, further comprising forming a gate stack on the substrate prior to the dispersing the etchant.

16. A method of manufacturing a semiconductor device, the method comprising:
etching a recess into a semiconductor material of a substrate, the recess being adjacent to a first structure, the first structure comprising a first spacer used as a mask during the etching the recess;
implanting conductive dopants into the recess while a photoresist mask protects a gate electrode adjacent to the recess;
removing the photoresist mask after the implanting the conductive dopants;
introducing nitrogen to an etchant canister at a flow rate of between about 1 L/min and about 500 L/min, the etchant canister holding a liquid etchant, wherein the liquid etchant comprises monoethanolamine (MEA); tetra-ethylammonium hydroxide (TEAH); tetra-n-butylammonium hydroxide (TBAH); imidazole; 1H-tetetrazole; or 1,2,4-1H-triazole, 1,2,3-1H-triazole;
pushing the liquid etchant to a showerhead using the nitrogen; and
dispersing the liquid etchant onto the semiconductor material of the substrate and in contact with a top surface of the first spacer, thereby widening the recess with the etchant and undercutting the first structure, wherein the dispersing the liquid etchant is performed after the removing the photoresist mask and wherein the dispersing the liquid etchant deepens the recess by at least 10 nm in a direction perpendicular to a major surface of the substrate.

17. The method of claim 16, wherein the implanting the conductive dopants is performed after the etching the recess and before the pushing the liquid etchant to the showerhead.

18. The method of claim 16, further comprising forming a gate stack on the substrate prior to the dispersing the liquid etchant onto the substrate.

19. The method of claim 16, further comprising filling the recess with a second semiconductor material.

20. The method of claim 16, further comprising cleaning the recess prior to the dispersing the liquid etchant, wherein the cleaning the recess comprises performing a CARO clean.

* * * * *